(12) United States Patent
Sutardja et al.

(10) Patent No.: US 8,098,106 B1
(45) Date of Patent: Jan. 17, 2012

(54) LOW NOISE VOLTAGE CONTROLLED OSCILLATOR (VCO)

(75) Inventors: Sehat Sutardja, Los Altos Hills, CA (US); Brian Brunn, Bee Cave, TX (US)

(73) Assignee: Marvell International Ltd., Hamilton (BM)

( * ) Notice: Subject to any disclaimer, the term of this patent is extended or adjusted under 35 U.S.C. 154(b) by 25 days.

(21) Appl. No.: 12/791,238

(22) Filed: Jun. 1, 2010

Related U.S. Application Data

(60) Provisional application No. 61/182,990, filed on Jun. 1, 2009.

(51) Int. Cl.
*H03B 5/12* (2006.01)
*H03K 3/282* (2006.01)

(52) U.S. Cl. .............................. 331/117 FE; 331/113 R

(58) Field of Classification Search .............. 331/113 R, 331/117 FE, 117 R, 167
See application file for complete search history.

(56) References Cited

U.S. PATENT DOCUMENTS

| | | | |
|---|---|---|---|
| 7,173,470 B2 * | 2/2007 | Murden et al. ................. | 327/291 |
| 7,289,002 B2 * | 10/2007 | Jeon et al. ................ | 331/117 FE |
| 7,592,875 B2 * | 9/2009 | Maget et al. ..................... | 331/46 |
| 7,659,784 B2 * | 2/2010 | Jang et al. ........................ | 331/40 |

* cited by examiner

*Primary Examiner* — Robert Pascal
*Assistant Examiner* — Levi Gannon

(57) ABSTRACT

In one embodiment, a voltage controlled oscillator (VCO) includes a tank circuit having a first node and a second node. A first pair of transistors includes a first transistor and a second transistor each having a gate, a drain, and a source. The gates of the first transistor and the second transistor are coupled together and coupled to the first node. A second pair of transistors includes a third transistor and a fourth transistor each having a gate, a drain, and a source. The gates of third transistor and the fourth transistor are coupled together and coupled to the second node. The first transistor and the second transistor are configured to alternately couple the second node to a first output node. The third transistor and the fourth transistor are configured to alternately couple the first node to a second output node.

20 Claims, 13 Drawing Sheets

LOW NOISE VOLTAGE CONTROLLED OSCILLATOR (VCO)

CROSS REFERENCE TO RELATED APPLICATIONS

The present disclosure claims priority to U.S. Provisional App. No. 61/182,990 for "Low Power VCO Structure" filed Jun. 1, 2009, the contents of which is incorporated herein by reference in their entirety.

BACKGROUND

Particular embodiments generally relate to voltage controlled oscillators (VCOs).

Unless otherwise indicated herein, the approaches described in this section are not prior art to the claims in this application and are not admitted to be prior art by inclusion in this section.

FIG. 1 depicts a conventional voltage controlled oscillator 100. An inductor/capacitor tank (LC tank) 101 is formed by a parallel or series connection of inductors 102a/102b and a capacitor 104. LC-tank 101 is coupled to an active circuit, which is represented as a cross-coupled transistor pair 106. As shown, cross-coupled transistor pair 106 is coupled in parallel to LC-tank 101 and includes a first transistor 108a (M1) and a second transistor 108b (M2).

In operation, for a resonant frequency, the impedance of LC-tank 101 becomes infinite and when energy is stored initially in LC tank 101, it circulates from voltage energy in capacitor 104 to current energy in inductors 102, and vice versa. This exchange of energy occurs at the resonant frequency, with the voltage and current being sinusoidal in quadrature phase with respect to each other and the ratio of the voltage and current amplitude being:

$$V/I = \sqrt{LC}.$$

Reactive components, such as inductors 102 and capacitor 104, have losses in the real world implementation. The losses may be modeled as series or parallel resistances to LC-tank 101. The losses may dampen the oscillating signal generated by LC-tank 101. The active circuit may be used to compensate for the losses.

A negative resistance is synthesized by cross coupled transistor pair 106 and is explained by describing the currents sourced/sinked by cross-coupled transistor pair 106 to/away from LC-tank 101. The current sourced/sinked is biased by a current source (Ibias) 110. Current source 110 may be a current mirror in one example. When a voltage at a node Vp is at its positive peak value, the resistance of LC-tank 101 is taking away current from node Vp. To compensate for this, transistor 108a sinks less current from node Vp. When the voltage at node Vp is at its negative peak value, the resistance of LC-tank 101 is sourcing current into node Vp and transistor 108a is sinking current from node Vp. The dual behavior also happens at node Vn.

Cross-coupled transistor pair 106 is behaving as a negative resistance because cross-coupled transistor pair 106 is sourcing current from nodes Vp or Vn when the voltage is at a maximum at the nodes and sinking current from nodes Vp or Vn when the voltage is at a minimum at the nodes. The ratio between the voltage at nodes Vp or Vn to the current flowing out of nodes Vp or Vn is negative.

Cross-coupled transistor pair 106 synthesizes the negative resistance that sustains the oscillation at a desired frequency. However, cross-coupled transistor pair 106 introduces noise that contributes to the total phase noise of oscillator 100. This may cause the output of LC-tank 101, which is a sine wave, to include some noise. When the sine wave is input into a downstream component from oscillator 100, this noise may cause jitter on the output of the component. Also, the component contributes noise as well. The gradual slope of the sine wave increases jitter on the output of the component that is added by the component. This causes uncertainty in when the component may output the signal and may cause problems in operation of a chip.

SUMMARY

In one embodiment, a voltage controlled oscillator (VCO) includes a tank circuit having a first node and a second node. A first pair of transistors includes a first transistor and a second transistor each having a gate, a drain, and a source. The gates of the first transistor and the second transistor are coupled together and coupled to the first node. A second pair of transistors includes a third transistor and a fourth transistor each having a gate, a drain, and a source. The gates of third transistor and the fourth transistor are coupled together and coupled to the second node. The first transistor and the second transistor are configured to alternately couple the second node to a first output node. The third transistor and the fourth transistor are configured to alternately couple the first node to a second output node.

In one embodiment, the VCO further comprises: a third pair of transistors comprising a fifth transistor and a sixth transistor each having a gate, a drain, and a source, wherein the drains of the fifth transistor and the sixth transistor are coupled to the tank circuit; a fourth pair of transistors comprising a seventh transistor and an eighth transistor each having a gate, a drain, and a source, wherein the gates of the seventh transistor and the eighth transistor are coupled together and coupled to the first node; and a fifth pair of transistors comprising a ninth transistor and a tenth transistor each having a gate, a drain, and a source, wherein the gates of ninth transistor and the tenth transistor are coupled together and coupled to the second node, wherein the drain of the seventh transistor and the source of the eighth transistor are coupled to the gate of the sixth transistor, and wherein the drain of the ninth transistor and the source of the tenth transistor are coupled to the gate of the fifth transistor.

In one embodiment, the VCO further comprises: a third pair of transistors comprising a fifth transistor and a sixth transistor each having a gate, a drain, and a source, wherein the drains of the fifth transistor and the sixth transistor are coupled to the tank circuit, wherein the gates of the fifth transistor and the sixth transistor are cross-coupled with the drains of the fifth transistor and the sixth transistor; a seventh transistor comprising a gate, a drain, and a source, wherein the gate of the seventh transistor is coupled to the gate of the fifth transistor and the drain is coupled to the second node; and an eighth transistor comprising a gate, a drain, and a source, wherein the gate of the eighth transistor is coupled to the gate of the sixth transistor and the drain is coupled to the first node.

In another embodiment, a VCO is provided comprising: a tank circuit having a first node and a second node; a first pair of transistors comprising a first transistor and a second transistor each having a gate, a drain, and a source, wherein the gates of first transistor and the second transistor are coupled together and coupled to the first node; a second pair of transistors comprising a third transistor and a fourth transistor each having a gate, a drain, and a source, wherein the gates of third transistor and the fourth transistor are coupled together and coupled to the second node, and a third pair of transistors comprising a fifth transistor and a sixth transistor each having a gate, a drain, and a source, wherein the drains of the fifth transistor and the sixth transistor are coupled to the tank circuit, wherein the first transistor and the second transistor are configured to alternately couple the second node to the gate of the sixth transistor, and wherein the third transistor and the fourth transistor are configured to alternately couple the first node to the gate of the fifth transistor.

In one embodiment, the VCO further comprises: a fourth pair of transistors comprising a seventh transistor and an eighth transistor each having a gate, a drain, and a source, wherein the gates of the seventh transistor and the eighth transistor are coupled together and coupled to the first node; and a fifth pair of transistors comprising a ninth transistor and a tenth transistor each having a gate, a drain, and a source, wherein the gates of ninth transistor and the tenth transistor are coupled together and coupled to the second node, wherein the seventh transistor and the eighth transistor are configured to alternately couple the second node to a first output node, and wherein the ninth transistor and the tenth transistor are configured to alternately couple the first node to a second output node.

In one embodiment, the VCO further comprises: a seventh transistor comprising a gate, a drain, and a source, wherein the gate of the seventh transistor is coupled to the gate of the fifth transistor and the drain is coupled to the second node; and an eighth transistor comprising a gate, a drain, and a source, wherein the gate of the eighth transistor is coupled to the gate of the sixth transistor and the drain is coupled to the first node.

In another embodiment, a method is provided comprising: turning on a first transistor in a first pair of transistors based on a first voltage at a first node of a tank circuit, the first voltage being between a first zero crossing and a first middle point of an oscillating voltage signal at the first node; coupling a second node of the tank circuit to a third node; turning off the first transistor thereby disconnecting the second node from the third node between the first middle point and a second zero crossing of the oscillating voltage signal at the first node; turning on a second transistor in the first pair of transistors based on a second voltage at the second node of the tank circuit, the second voltage being between the second zero crossing and a second middle point of the oscillating voltage signal at the first node; coupling the second node of the tank circuit to the third node; and turning off the second transistor thereby disconnecting the second node from the third node between the second middle point and a third zero crossing of the oscillating voltage signal at the first node.

The following detailed description and accompanying drawings provide a better understanding of the nature and advantages of the present invention.

DETAILED DESCRIPTION

Described herein are techniques for a voltage controlled oscillator (VCO). In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1:
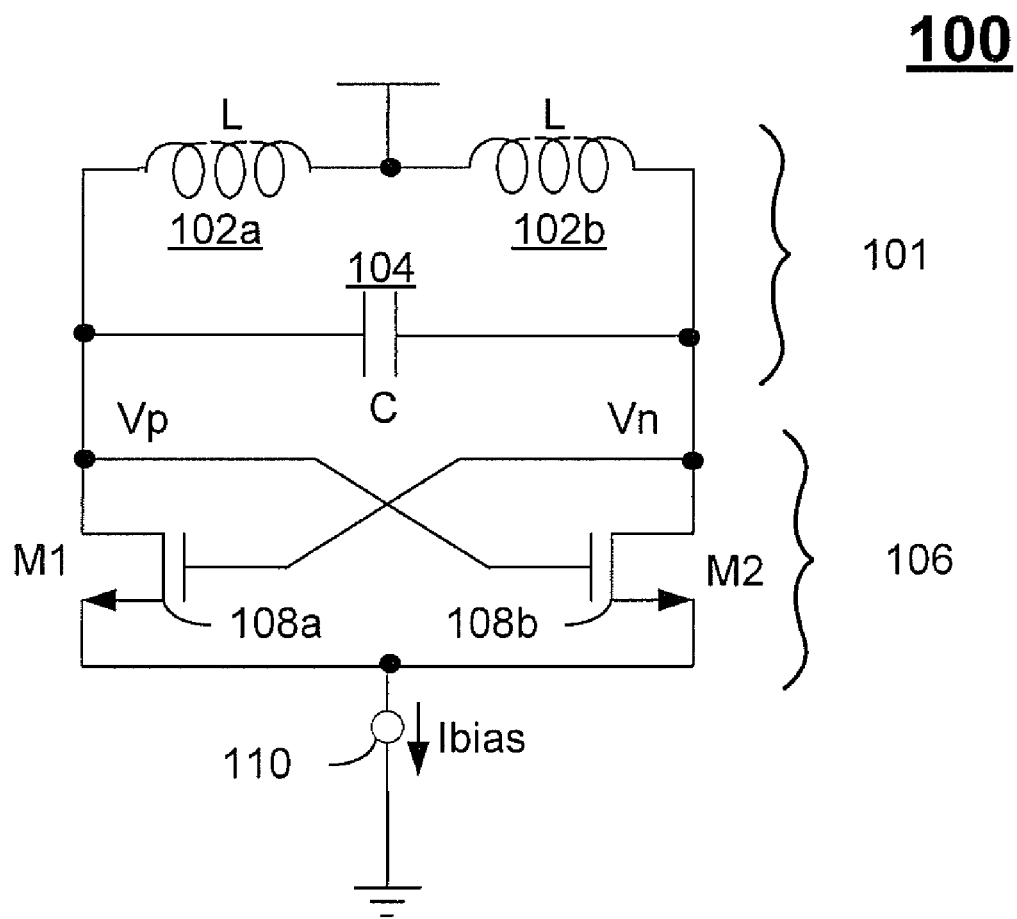
FIG. 1 depicts a conventional voltage controlled oscillator.
Figure 2:
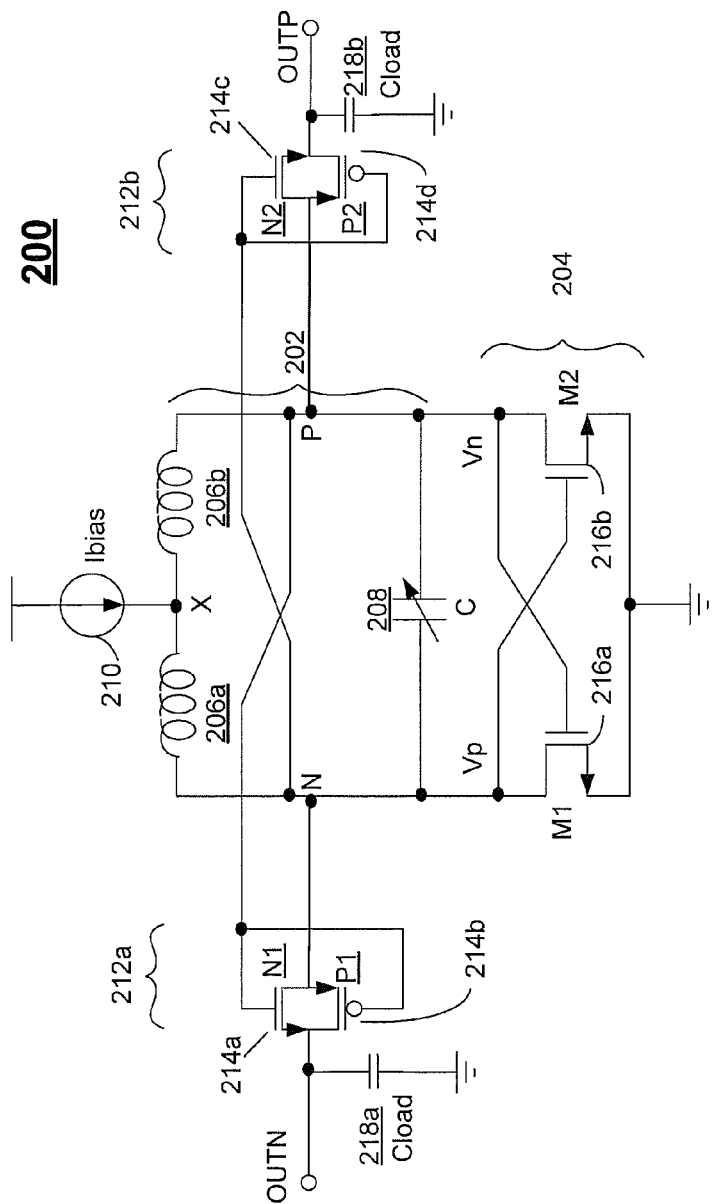
FIG. 2 depicts an example of a voltage controlled oscillator according to one embodiment.

FIG. 2 depicts an example of a voltage controlled oscillator according to one embodiment. Voltage controlled oscillator 200 includes an inductor-capacitor (LC) tank 202 and a cross-coupled pair of transistors 204. LC tank 202 includes a pair of inductors 206a and 206b coupled together at a node X and a capacitor 208. Capacitor 208 may be a tunable capacitor in one embodiment. A current source 210 (Ibias) is used to provide a bias current.

Cross-coupled pair of transistors 204 includes a first transistor 216a (M1) and a second transistor 216b (M2). Transistors M1 and M2 may be N-channel metal oxide semiconductor field effect transistors (MOSFETs) but may also be implemented using other components, such as P-channel MOSFETs. Transistors M1 and M2 have their gates cross-coupled with the drain of the other transistor. Also, the drains of transistors M1 and M2 are each coupled to LC tank 202. Cross-coupled transistor pair 204 provides a negative resistance by sourcing/sinking current into/out of LC tank 202.

Particular embodiments provide a pair of switches 212a and 212b that are used to sharpen the edge of an output signal at nodes OUTN or OUTP. By sharpening the edge of the output signal, the slope of a sine wave generated by LC tank 202 is steepened around the zero crossing of the sine wave. The sine wave is thus shaped to be more like a square wave. By steepening the slope of the output signal, the effect of noise contributed by a downstream component is lessened. This concept will be described in more detail below.

Switches 212 may be a self-biased transmission (T)-gate like switch. For example, switches 212 may include a P-type transistor and an N-type transistor. In one example, MOSFET devices may be used but other devices may also be used.

Switch 212a includes a first transistor 214a (N1) that is an N-type transistor and a second transistor 214b (P1) that is a P-type transistor. The gates of transistors N1 and P1 are coupled together. Also, the gates are coupled to a node P of LC tank 202.

Switch 212b includes a third transistor 214c (N2) that is an N-type transistor and a fourth transistor 214d (P2) that is a P-type transistor. The gates of transistors N2 and P2 are coupled together and coupled to a node N of LC tank 202.

The gates of transistors N1/P1 and N2/P2 are cross-coupled with the drain/source of the other pair of transistors. That is, the gates of transistors N1 and P1 are coupled to the drain of transistor N2 and the source of transistor P2. Also, the gates of transistors N2 and P2 are coupled to the drain of transistor N1 and the source of transistor P1.

The above configuration causes transistors N1/N2 or P1/P2 to be off at a zero crossing of a voltage waveform being input into the gates of transistors N1/N2 or P1/P2 and then turn on between the zero crossing and middle point of the voltage waveform. For switch 212b, transistor P2 turns on between the zero crossing and middle point of an oscillating voltage waveform at node N when the voltage goes negative. Also, transistor N2 turns on between the zero crossing and middle point of the voltage waveform at node N when the voltage goes positive. For switch 212a, transistor N1 turns on between the zero crossing and middle point of an oscillating voltage waveform at node P when the voltage goes positive. Also, transistor P1 turns on between the zero crossing and middle point of the voltage waveform at node P when the voltage goes negative.

Figure 3:
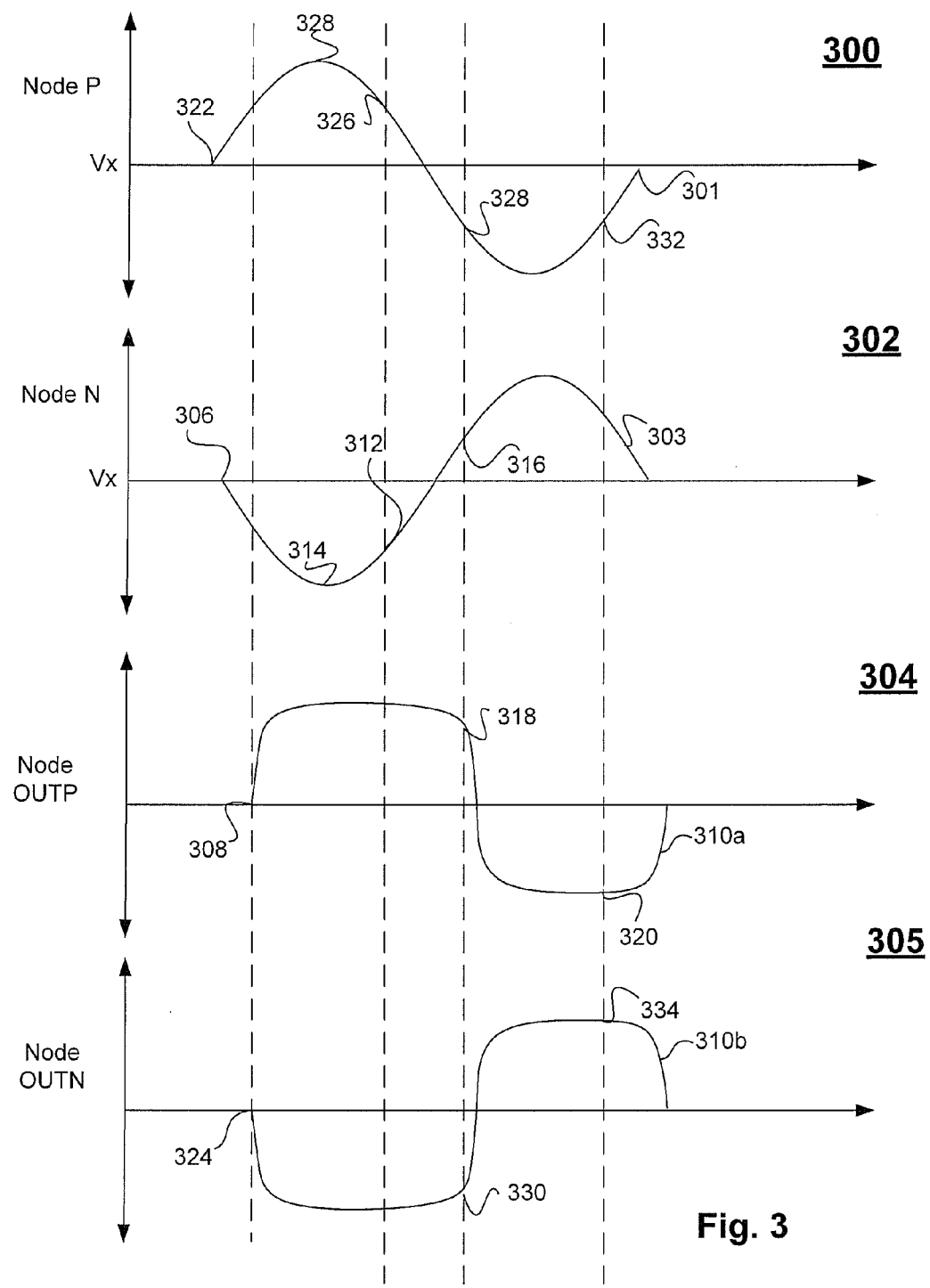
FIG. 3 shows voltage waveforms illustrating the operation of switches of the voltage controlled oscillator according to one embodiment.

FIG. 3 shows voltage waveforms illustrating the operation of switches 212a and 212b according to one embodiment. A graph 300 shows a voltage waveform 301 at node P; a graph 302 shows a voltage waveform 303 at node N; a graph 304 shows a voltage waveform 310a at node OUTP; and a graph 305 shows a voltage waveform 310b at node OUTN. Voltages on nodes P and N are described with respect to the voltage on node X (Vx).

The operation of switch 212b will first be described. As the voltage at node N is at the zero crossing at a point 306, transistor P2 is off. Transistor P2 then turns on when the voltage at node N is low enough to turn transistor P2 on based on a threshold voltage of transistor P2. For example, when the voltage at node N reaches a voltage equal to the threshold voltage/2 ($V_t/2$) of transistor P2, transistor P2 turns on at a point 308. Point 308 may be after the zero crossing but before a middle point of voltage waveform 303 at node N.

After transistor P2 turns on, the source of transistor P2 is connected to node P and the voltage at node OUTP will then follow the voltage at node P. In this case, because the voltage at node OUTP is below the voltage at node P, the voltage at node OUTP needs to catch up with the voltage at node P. This causes a steeper slope for a voltage waveform 310a as the voltage at node OUTP increases to follow the voltage at node P.

At a point 312, the voltage at node N has passed a middle point 314 and has gone above a voltage (e.g., $V_t/2$) that turns transistor P2 off. After transistor P2 turns off, the voltage stays around this level because OUTP is disconnected from node P as transistors N2 and P2 are both off. However, the charge from capacitor 218b keeps the voltage around the level when transistor P2 turned off. Thus, even though the voltage at node P is going down, the voltage at OUTP stays around the same level as it was when transistor P2 turned off. Explicit capacitors may be optional as receiving circuits may have input capacitance.

At a point 316, the voltage at node N reaches a voltage that turns on transistor N2 based on the threshold voltage of transistor N2. For example, the voltage at the gate of transistor N2 is greater than the threshold voltage/2 ($V_t/2$) of transistor N2. At a point 318, transistor N2 turns on and connects node OUTP to node P. Point 318 may be after the zero crossing but before a middle point of voltage waveform 303 at node N. As was described above, the voltage at node OUTP now needs to track the voltage at node P and thus the voltage at node OUTP goes down in a steep slope to catch up with the voltage at node P.

Transistor N2 stays on until the voltage at node N goes below a voltage (e.g., $V_t/2$) to turn transistor N2 off at a point 320. Transistor N2 then turns off and node OUTP is disconnected from node P. A charge across capacitor 218b keeps the voltage at OUTP around a level when transistor N2 turned off at point 320.

Graph 305 shows a voltage waveform 310b for the node OUTN. The operation of switch 212a is similar to the operation of switch 212b. As the voltage at node P is at the zero crossing at a point 322, transistor N1 is off. Transistor N1 then turns on when the voltage at node P is high enough to turn transistor N1 on based on the threshold voltage of transistor N1. For example, when the voltage at node P reaches a voltage equal to the threshold voltage/2 ($V_t/2$) of transistor N1, transistor N1 turns on at a point 324. Point 324 may be after the zero crossing but before a middle point of voltage waveform 301 at node P.

When transistor N1 turns on, the drain of transistor N1 is connected to node N and the voltage at node OUTN will follow the voltage at node N when transistor N1 is on. In this case, because the voltage at node OUTN is below the voltage at node N, the voltage needs to catch up with the voltage waveform of node N. This causes a steeper slope for the voltage waveform 310b.

At a point 326, the voltage at node P has passed a middle point and has gone below a voltage (e.g., $V_t/2$) that turns transistor N1 off. After transistor N1 turns off, the voltage stays around this level because OUTN is disconnected from node N as transistors N1 and P1 are both off. The charge from capacitor 218a keeps the voltage around the level when transistor N1 turned off. Thus, even though the voltage at node N is going up, the voltage at OUTN stays around the same level as it was when transistor N1 turned off. Explicit capacitors may be optional as receiving circuits may have input capacitance.

At a point 328, the voltage at node P reaches a voltage that turns on transistor P1 based on the threshold voltage of transistor P1. At a point 330, transistor P1 turns on and connects node OUTN to node N. Point 330 may be after the zero crossing but before a middle point of voltage waveform 301 at node P. As was described above, the voltage at node OUTN now needs to track the voltage at node N and thus goes up in a steep slope to catch up with the voltage at node N.

Transistor P1 stays on until the voltage at node P goes above a voltage (e.g., $V_t/2$) at a point 332 to turn transistor P1 off. Transistor P1 then turns off and node OUTN is disconnected from node N at a point 334. A charge across capacitor 218a keeps the voltage at OUTN around a level when transistor P1 turned off at point 334.

Accordingly, by having transistor P2 or transistor N2 turn on between a zero crossing and middle point of the voltage at node N and transistors P1 and N1 turn on between a zero crossing and middle point of the voltage at node P, the voltage waveform at OUTN or OUTP becomes sharper and more square-like than a voltage waveform at nodes N or P. That is, the slope around the zero crossing of voltage waveform 310a or 310b is steeper than the slope of the voltage waveform at node P or node N. This reduces the effect of noise on components downstream because with a steeper slope, the noise effect at the output of a component is lessened.

Figure 4A:
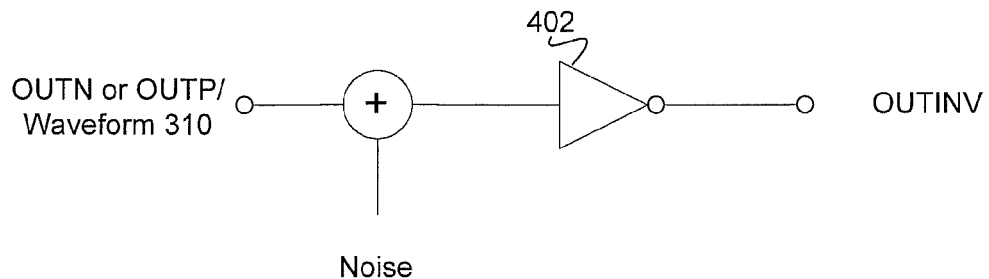
FIGS. 4A and 4B show an example of the reduction in noise according to one embodiment.
Figure 4B:
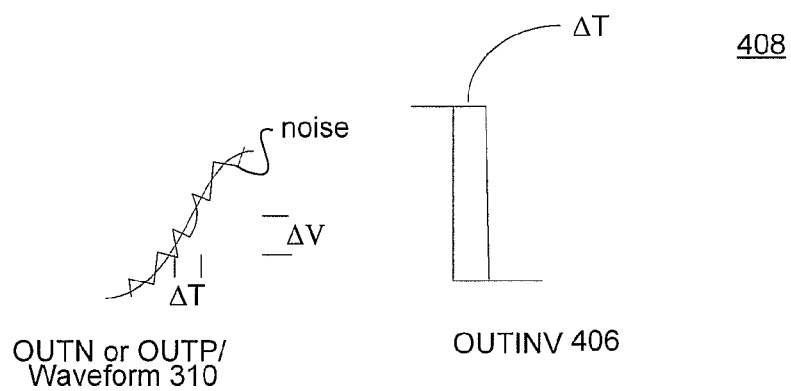
Figure 4B:
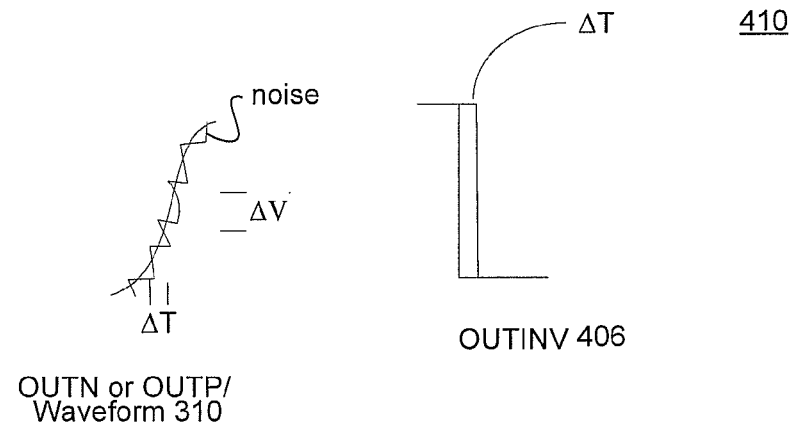

FIGS. 4A and 4B show an example of the reduction in noise according to one embodiment. In FIG. 4A, if a voltage waveform 310 is input into a component, such as an inverter 402, inverter 402 adds noise and causes jitter on the output of inverter 402. A noiseless inverter is modeled as receiving the input waveform 310 and noise.

FIG. 4B shows an input waveform 310 and an output waveform 406 of inverter 402. Waveform 310 may include noise. This noise may cause the output of inverter 402 to vary within a time ΔT. This provides uncertainty as to when a waveform 406 will be output by inverter 402 and may cause problems in the operation of a chip.

The amount of ΔT may be determined by a variation in voltage of waveform 310 due to the noise and the slope of waveform 310: ΔT=ΔV/slope. At 408, a smaller slope is shown for waveform 310 and the ΔT on the output (OUTINV 406) of inverter 402 is shown. At 410, the slope of waveform 310 is larger than the slope shown at 408. The ΔT on the output (OUTINV 406) of inverter 402 is smaller. Thus, by making the slope steeper (larger), ΔT becomes smaller. Following this, particular embodiments make the slope sharper around the zero crossing of voltage waveform 310, which causes less jitter on the output of inverter 402.

Figure 5:
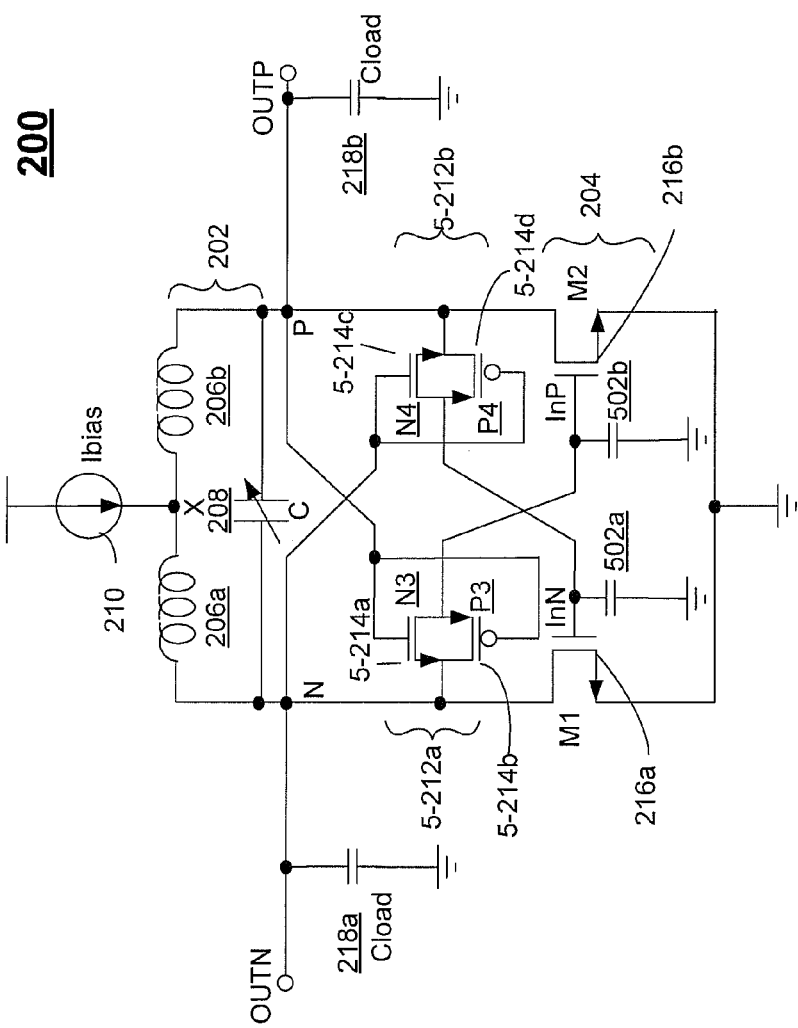
FIG. 5 shows another example of the voltage controlled oscillator according to one embodiment.

FIG. 5 shows another example of voltage controlled oscillator 200 according to one embodiment. In this example, switches 5-212a (transistors 5-214a and 5-214b) and 5-212b (transistors 5-214c and 5-214d) are coupled to transistors M1 and M2. Switches 5-212a and 5-212b cause an input signal into transistors M1 or M2 to be sharper with a steeper slope than the signal at nodes N or P.

The configuration of switches 5-212a and 5-212b is similar to the configuration of switches 212a and 212b as described in FIG. 2. The gates of transistor N3 and transistor P3 are coupled together. Also, the gates of transistors N3 and P3 are coupled to node P.

The drain of transistor N3 and source of transistor P3 are coupled to a node InP at a gate of transistor M2. Also, the source of transistor N3 and the drain of transistor P3 are coupled to node N of LC tank 202 and the drain of transistor M1.

The gates of transistors N4 and P4 are coupled together and then coupled to node N. The drain of transistor N4 and the source of transistor P4 are coupled to node InN to a gate of transistor M1. The source of transistor N4 and the drain of transistor P4 are also coupled to node P and the drain of transistor M2.

The operation of switches 5-212a and 5-212b provides waveforms that are similar to the operation described in FIG. 2. However, waveforms 310a and 310b of FIG. 3 are input into nodes InP and InN, respectively, instead of nodes OUTP and OUTN. That is, for node InP, waveform 310a shown in FIG. 3 would be input into the gate of transistor M2 instead of into node OUTP. Also, waveform 310b as described with respect to node OUTN is input into node InN at the gate of transistor M1 instead of into node OUTN.

Capacitors 502a and 502b are also provided to maintain a charge at InN or InP, respectively. Capacitors 502a and 502b perform a similar function as described for capacitors 218a and 218b in maintaining a charge at the inputs of transistors M1 or M2. Explicit capacitors may be optional as receiving circuits may have input capacitance.

The effect of driving transistors M1 and M2 with waveforms 310a and 310b causes transistors M1 and M2 to turn on and off faster than if the waveforms at nodes P and N were being input into transistors M1 and M2. This causes less noise on a current through transistors M1 and M2, which in turn minimizes the noise on the current output through nodes OUTP and OUTN.

Figure 6:
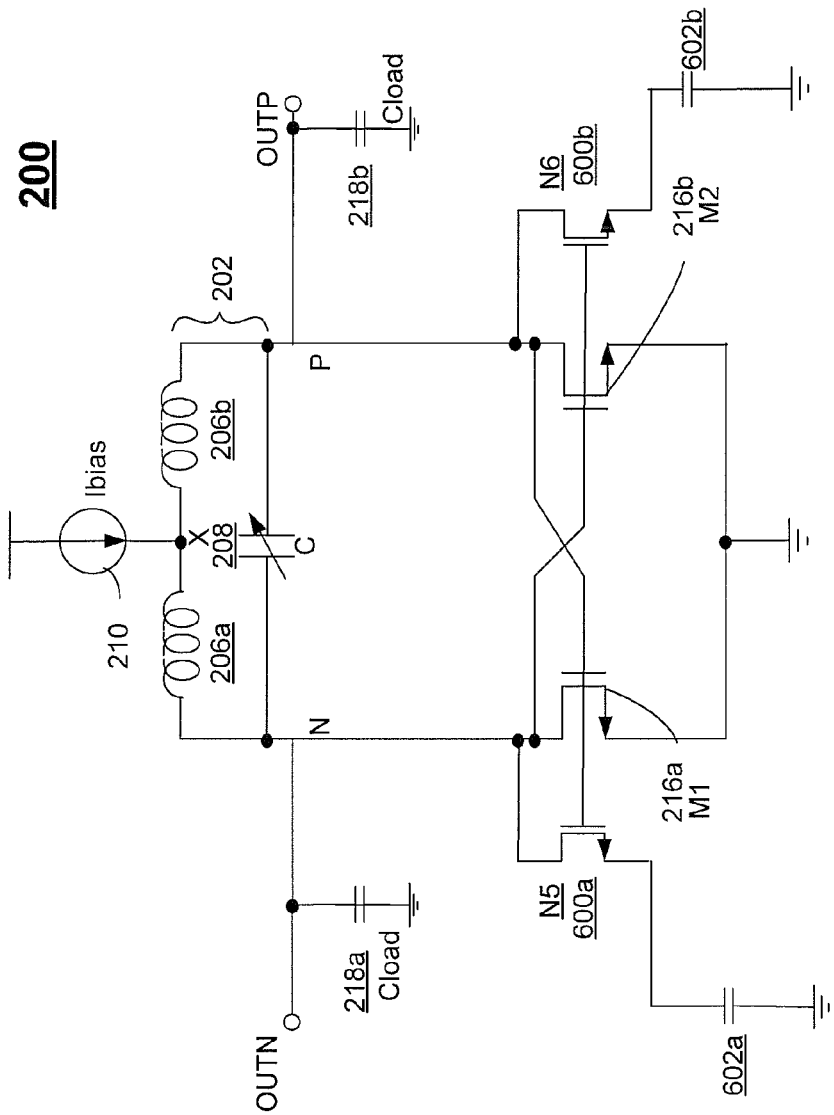
FIG. 6 shows yet another example of the voltage controlled oscillator according to one embodiment.

FIG. 6 shows yet another example of VCO 200 according to one embodiment. Transistors 600a (N5) and 600b (N6) are placed in parallel to transistors 216a (M1) and 216b (M2), respectively.

Transistor N5 has its gate coupled to the gate of transistor M1. Also, the drain of transistor N5 is coupled to the drain of transistor M1. The source of transistor N5 is coupled to a capacitor 602a.

Similarly, transistor N6 has its gate and drain coupled to the gate and drain, respectively, of transistor M2. Also, the source of transistor N6 is coupled to a capacitor 602b. Transistors N5 and N6 improve the signal-to-noise ratio of the output signal at OUTN and OUTP without consuming any direct current (DC). After start-up, capacitors 602a and 602b charge up to a nominal voltage. During oscillation, as the voltage on node P goes higher than the voltage on node N, transistor N5 allows the charge to flow from node N onto capacitor 602a. As the voltage on node P continues higher and node N continues lower, when node N is below the voltage on capacitor 602a, transistor N5 allows the charge to flow from capacitor 602a onto node N. By pulling away charge from node N as node N is going lower than node P, the resulting waveform on node N has a steeper slope. At the peak of the oscillation, where slope is not critical, the charge is returned.

The same is true for transistor M2 and transistor N6. The current being sinked or sourced in or out of LC tank 202 has a steeper slope and sharper edge than if transistor N6 was not included. It should be noted that the transistors N5, N6, M1 and M2 may be implemented using NMOS or PMOS transistors.

Figure 7A:
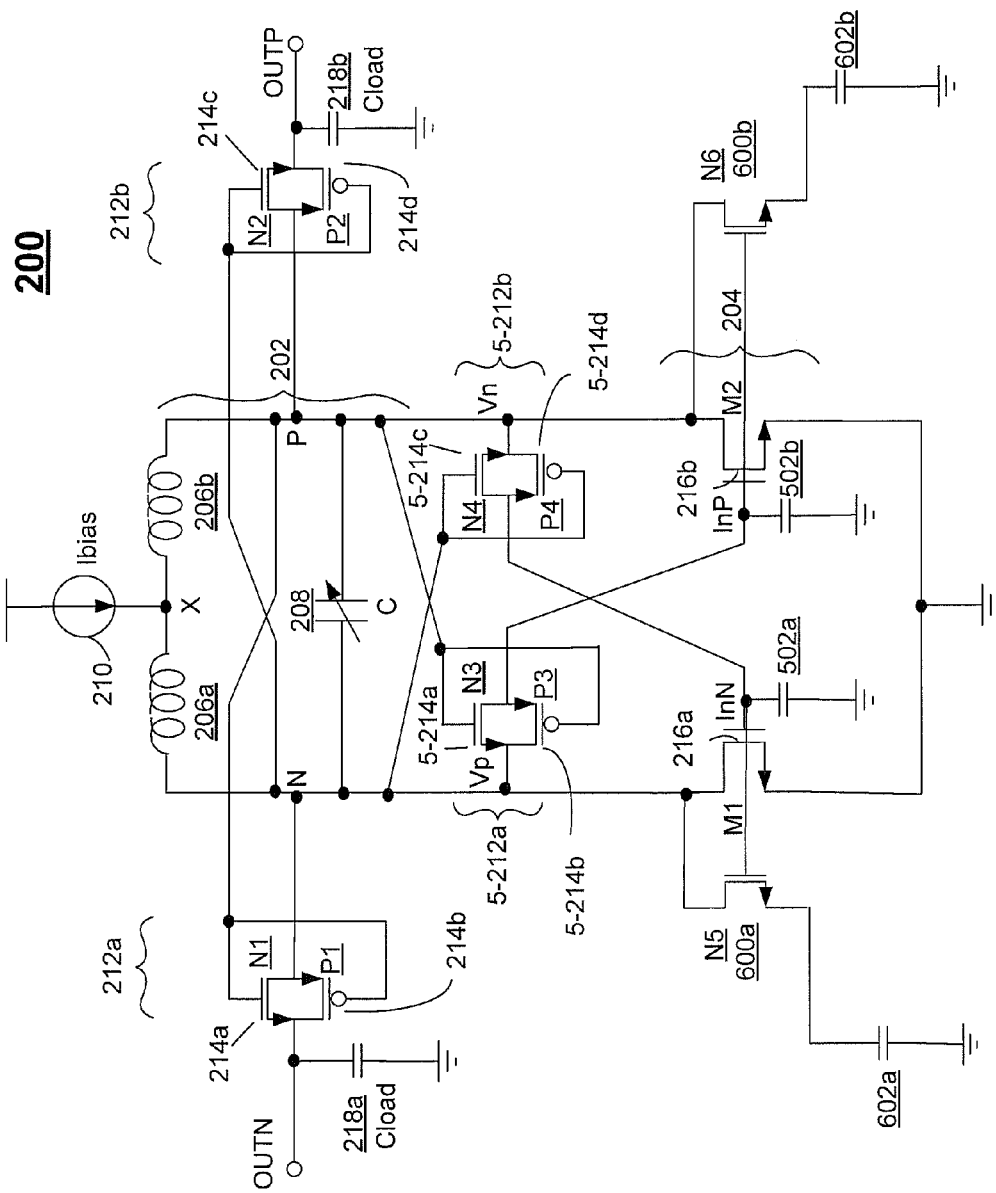
FIGS. 7A-7D show examples of a voltage controlled oscillator according to various embodiments.

The examples shown in FIGS. 2, 5, and 6 may be used in any combination. FIG. 7A depicts an example of voltage controlled oscillator 200 implemented based on a combination of the configurations shown in FIGS. 2, 5 and 6.

Inductor-capacitor (LC) tank 202, pair of inductors 206a and 206b, capacitor 208, current source 210 (Ibias), and cross-coupled pair of transistors 204 including first transistor 216a (M1) and second transistor 216b (M2) operate similarly as described herein, such as with respect to FIGS. 2, 5, and 6.

Pair of switches 212a (transistors 214a and 214b) and 212b (transistors 214c and 214d) operate similarly as described herein, such as with respect to FIG. 2. Pair of switches 5-212a (transistors 5-214a and 5-214b) and 5-212b (transistors 5-214c and 5-214d) and capacitors 502a and 502b operate similarly as described herein, such as with respect to FIG. 5. Transistors 600a and 600b and capacitors 602a and 602b operate similarly as described herein, such as with respect to FIG. 6. For example, switches 212a and 212b are used to sharpen the edge of an output signal at nodes OUTN or OUTP. Also, switches 5-212a and 5-212b cause an input signal into transistors M1 or M2 to be sharper with a steeper slope than the signal at nodes N or P. Further, resulting waveforms on node N and node P have a steeper slope due to transistors 600a and 600b and capacitors 602a and 602b.

Figure 7B:
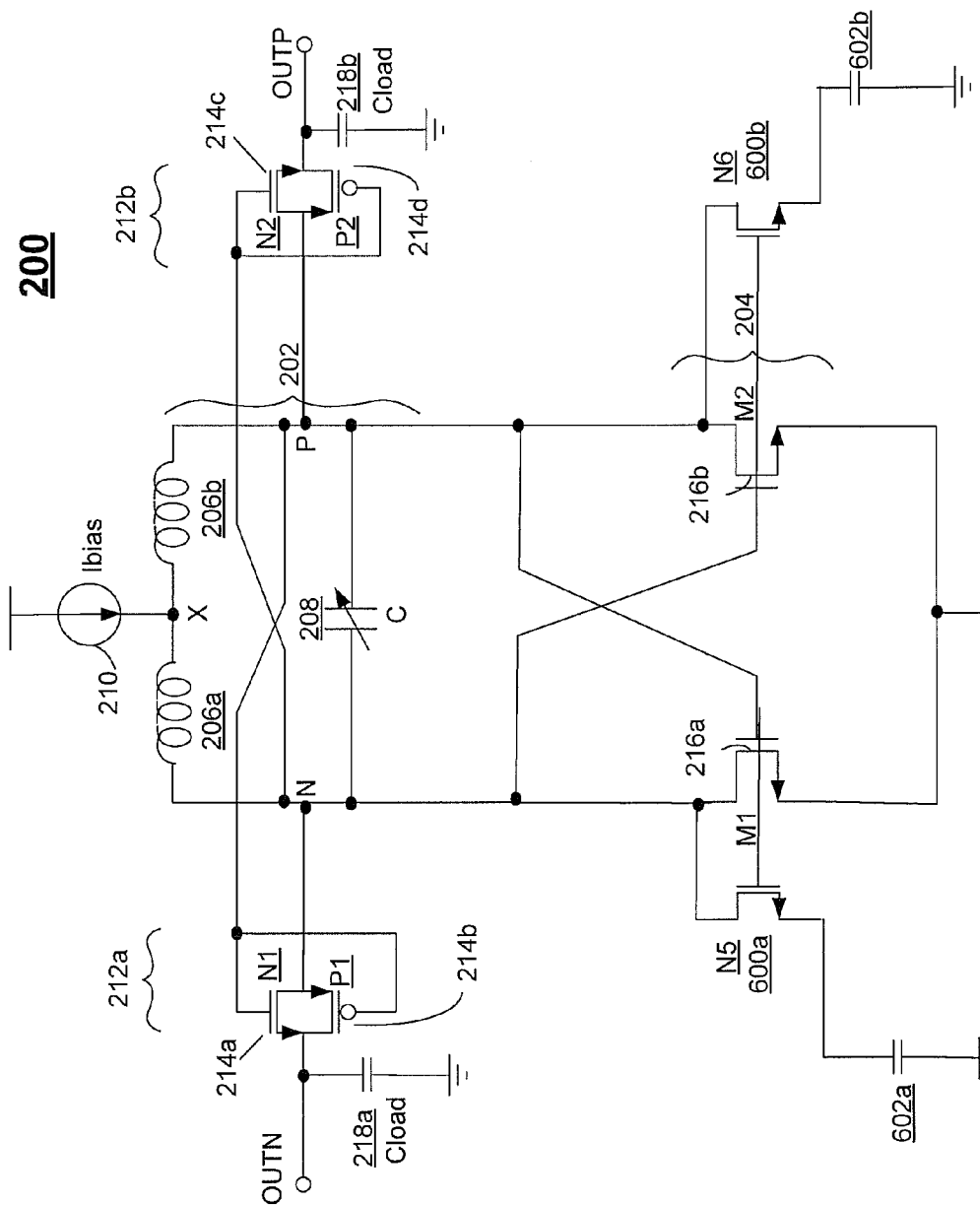
Figure 7C:
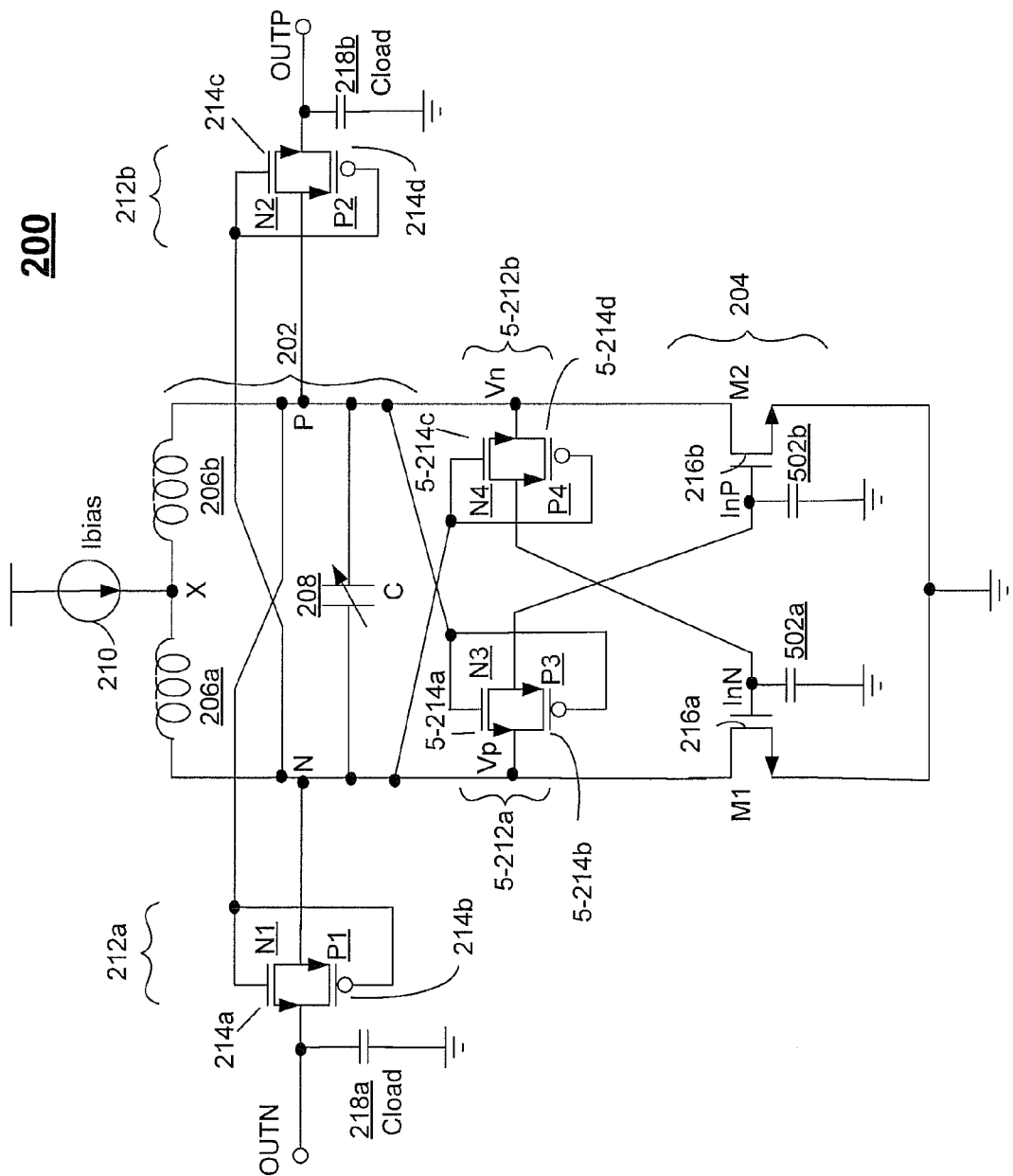
Figure 7D:
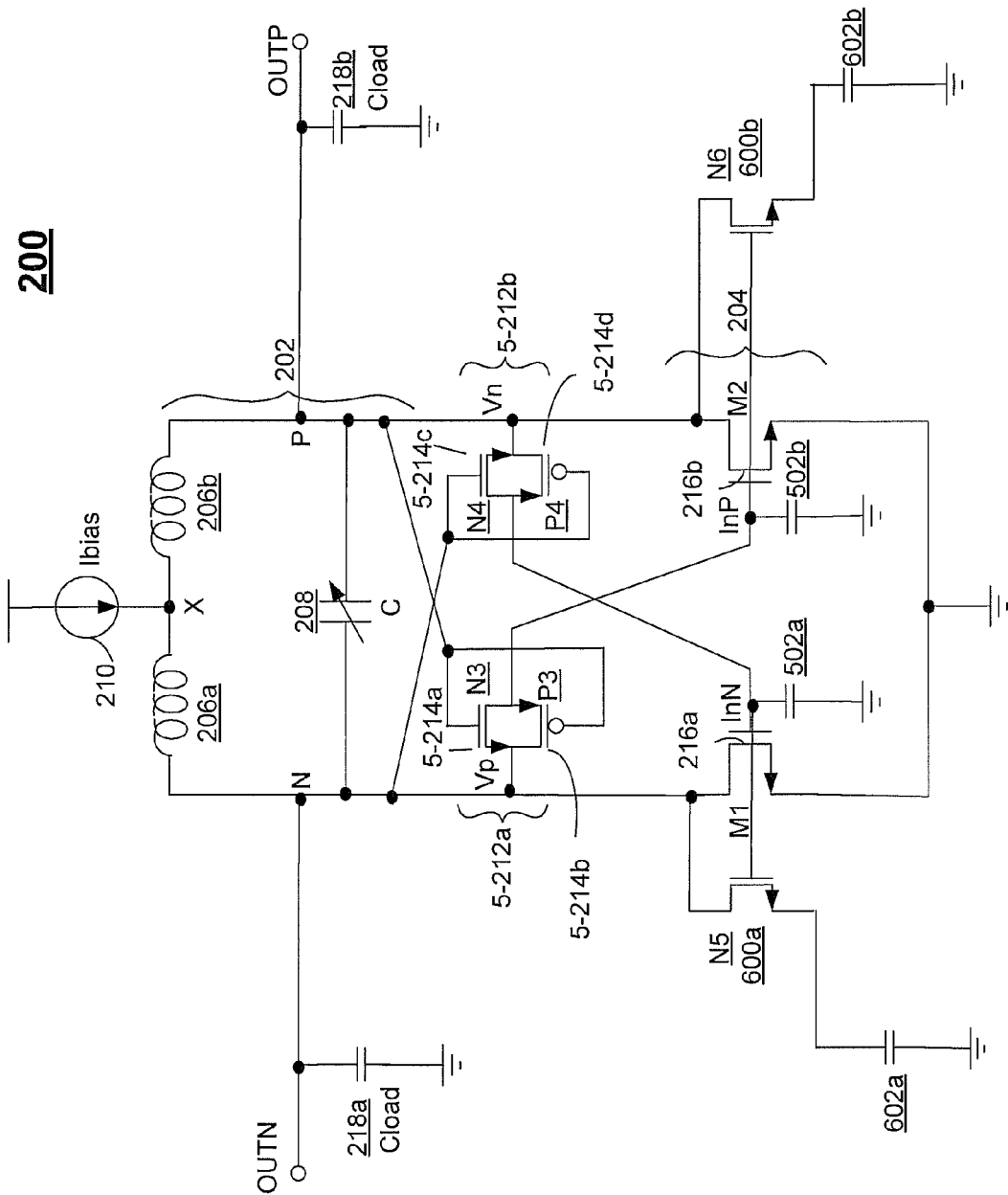

Although all three configurations of FIGS. 2, 5, and 6 are shown in FIG. 7A, other combinations may be used. For example, FIG. 7B shows another example of voltage controlled oscillator 200 implemented based on a combination of configurations shown in FIGS. 2 and 6; FIG. 7C shows another example of voltage controlled oscillator 200 implemented based on a combination of configurations shown in FIGS. 2 and 5; and FIG. 7D shows another example of voltage controlled oscillator 200 implemented based on a combination of configurations shown in FIGS. 5 and 6.

Figure 8:
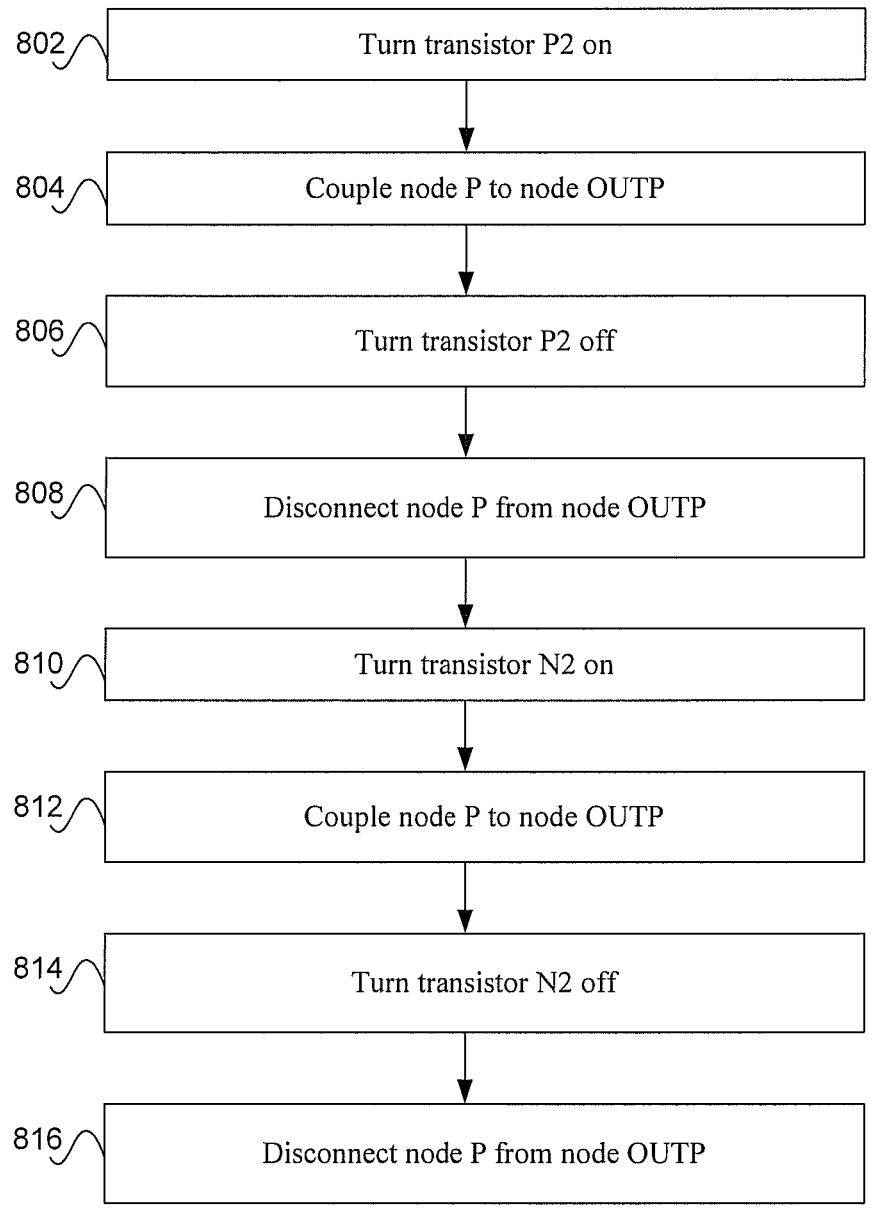
FIG. 8 depicts a simplified flowchart of a method for providing an oscillating signal according to one embodiment.

FIG. 8 depicts a method for providing an oscillating signal according to one embodiment. This method is described with respect to switch 212b. At 802, a transistor P2 is turned on. Transistor P2 may be turned on between the zero crossing and middle point of an oscillating voltage waveform at a node N.

At 804, node P is coupled to node OUTP. Capacitor 218b is also charged by a bias current supplied by current source 210.

At 806, transistor P2 is turned off.

At 808, node P is thus disconnected from node OUTP. The charge from capacitor 218b maintains a voltage level at node OUTP.

At 810, transistor N2 turns on. Transistor N2 may be turned on between the zero crossing and middle point of the oscillating voltage waveform at a node N.

At 812, node P is coupled to node OUTP. Capacitor 218b is also charged by a bias current supplied by current source 210.

At 814, transistor N2 is turned off. At 816, node P is thus disconnected from node OUTP. The charge from capacitor 218b maintains a voltage level at node OUTP.

The above method may be performed for switch 212a also. Further, the above method may be performed for the example shown in FIG. 5; however, OUTP and OUTN are replaced by InP and InN and capacitors 218a and 218b are replaced by capacitors 502a and 502b.

Figure 9A:
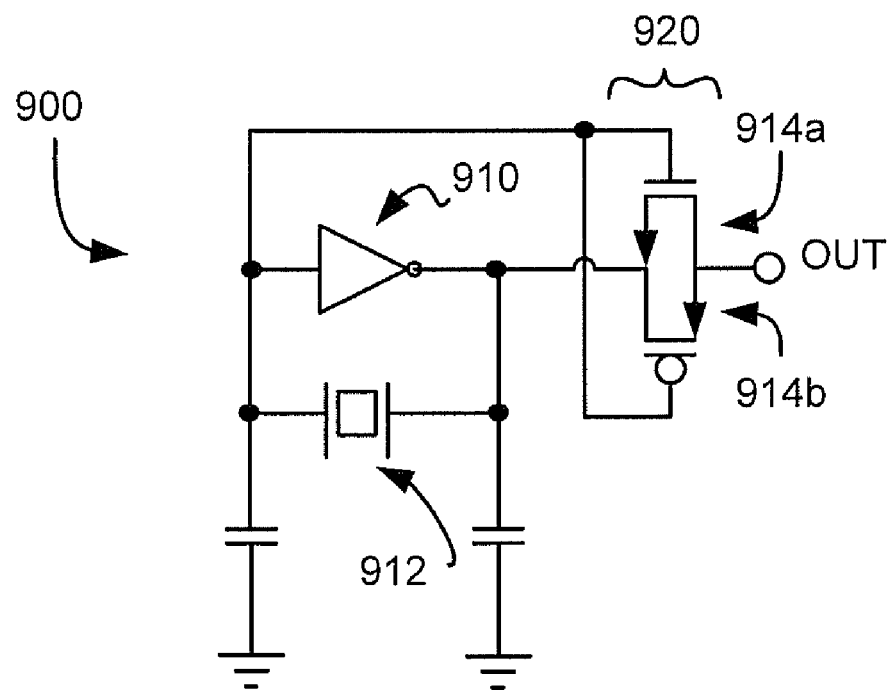
FIGS. 9A-C show examples of a crystal oscillator arrangement according to various embodiments.
Figure 9B:
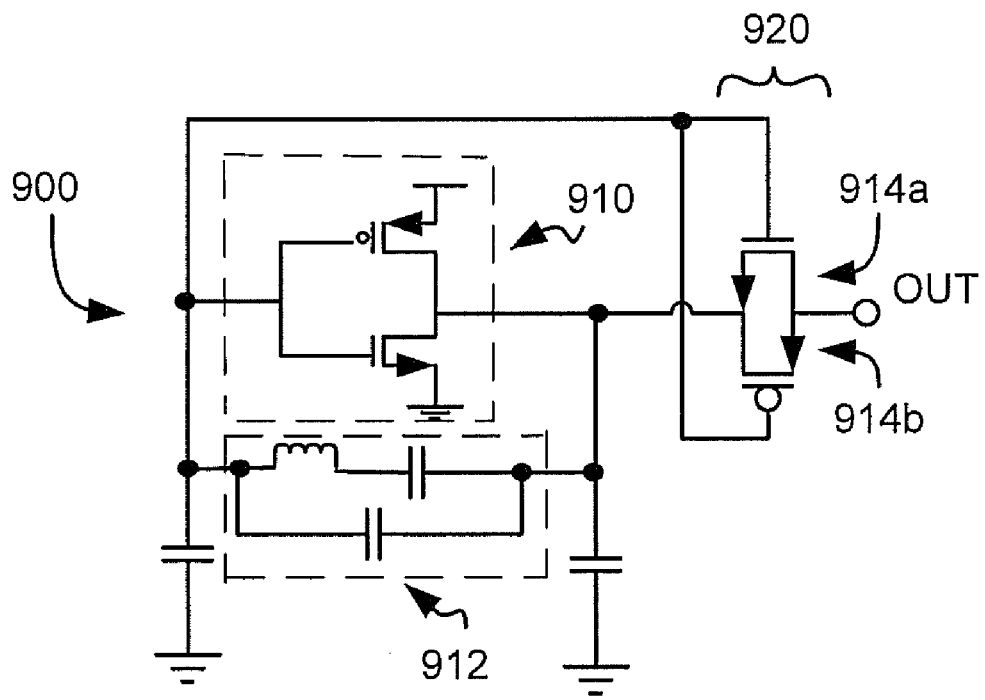
Figure 9C:
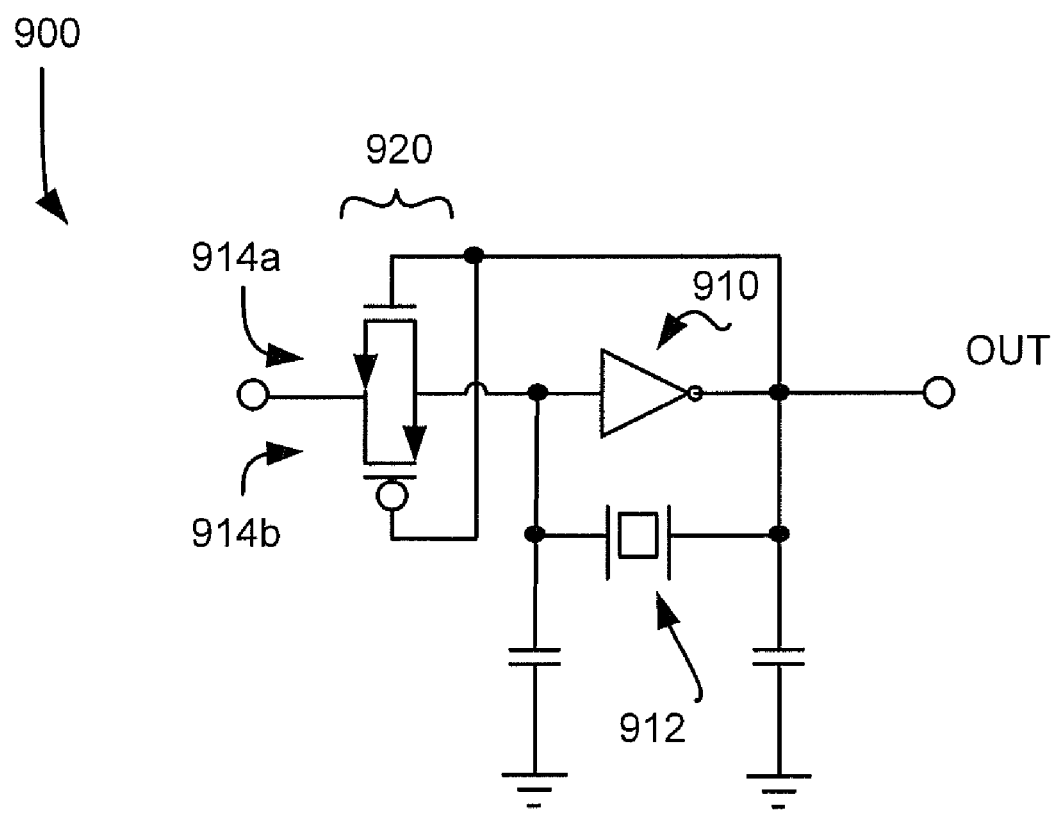

Switch 212a or 212b may also be used in a crystal oscillator arrangement to effect edge sharpening. For example, as shown in FIG. 9A, a crystal oscillator arrangement 900 includes an inverter 910, a crystal source 912 and a switch 920 comprising a first transistor 914a (N1) that is an N-type transistor and a second transistor 914b (P1) that is a P-type transistor. Similar to switch 212a or 212b as described above, the switch 920 can be used to sharpen the edges of an output signal of the crystal oscillator arrangement 900. FIG. 9B illustrates a circuit schematic of the crystal oscillator arrangement 900. In general, the switch 212a can be implemented in non-differential oscillators or other circuits where a square wave presents a lower noise sensitivity than a sine wave and where a substantially square wave is desirable. In an alternative embodiment as shown in FIG. 9C, the switch 920 is disposed on the input side of the crystal oscillator arrangement 900 to sharpen the edges of an input signal.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A voltage controlled oscillator (VCO) comprising:
a tank circuit having a first node and a second node;
a first pair of transistors comprising a first transistor and a second transistor each having a gate, a drain, and a source, wherein the gates of the first transistor and the second transistor are coupled together and coupled to the first node; and
a second pair of transistors comprising a third transistor and a fourth transistor each having a gate, a drain, and a source, wherein the gates of third transistor and the fourth transistor are coupled together and coupled to the second node,
wherein the first transistor and the second transistor are configured to alternately couple the second node to a first output node, and
wherein the third transistor and the fourth transistor are configured to alternately couple the first node to a second output node.

2. The VCO of claim 1, wherein:
the gates of the first transistor and the second transistor are coupled with the drain of the third transistor and the source of the fourth transistor at the first node, and
the gates of the third transistor and the fourth transistor are coupled with the drain of the first transistor and the source of the second transistor at the second node.

3. The VCO of claim 1, wherein:
the first transistor turns on between a first zero crossing and a first middle point of an oscillating voltage signal at the first node and turns off between the first middle point and a second zero crossing of the oscillating voltage signal at the first node, and
the second transistor turns on between the second zero crossing and a second middle point of the oscillating voltage signal at the first node and turns off between the second middle point and a third zero crossing of the oscillating voltage signal at the first node.

4. The VCO of claim 3, wherein:
the second node is coupled to the first output node when the first transistor or second transistor are on, and
the second node is not coupled to the first output node when the first transistor and the second transistor are both off.

5. The VCO of claim 1, wherein:
the fourth transistor turns on between a first zero crossing and a first middle point of an oscillating voltage signal at the second node and turns off between the first middle point and a second zero crossing of the oscillating voltage signal at the second node, and
the third transistor turns on between the second zero crossing and a second middle point of the oscillating voltage signal at the second node and turns off between the second middle point and a third zero crossing of the oscillating voltage signal at the second node.

6. The VCO of claim 5, wherein:
the first node is coupled to the second output node when the third transistor or fourth transistor are on, and
the first node is not coupled to the second output node when the third transistor and fourth transistor are both off.

7. The VCO of claim 1, further comprising:
a first capacitor coupled the first pair of transistors and the first output node, and
a second capacitor coupled to the second pair of transistors and the second output node.

8. The VCO of claim 1, further comprising:
a third pair of transistors comprising a fifth transistor and a sixth transistor each having a gate, a drain, and a source, wherein the drains of the fifth transistor and the sixth transistor are coupled to the tank circuit;
a fourth pair of transistors comprising a seventh transistor and an eighth transistor each having a gate, a drain, and a source, wherein the gates of the seventh transistor and the eighth transistor are coupled together and coupled to the first node; and
a fifth pair of transistors comprising a ninth transistor and a tenth transistor each having a gate, a drain, and a source, wherein the gates of ninth transistor and the tenth transistor are coupled together and coupled to the second node,
wherein the drain of the seventh transistor and the source of the eighth transistor are coupled to the gate of the sixth transistor, and
wherein the drain of the ninth transistor and the source of the tenth transistor are coupled to the gate of the fifth transistor.

9. The VCO of claim 1, further comprising:
a third pair of transistors comprising a fifth transistor and a sixth transistor each having a gate, a drain, and a source, wherein the drains of the fifth transistor and the sixth transistor are coupled to the tank circuit, wherein the gates of the fifth transistor and the sixth transistor are cross-coupled with the drains of the fifth transistor and the sixth transistor, a seventh transistor comprising a gate, a drain, and a source, wherein the gate of the seventh transistor is coupled to the gate of the fifth transistor and the drain is coupled to the second node; and an eighth transistor comprising a gate, a drain, and a source, wherein the gate of the eighth transistor is coupled to the gate of the sixth transistor and the drain is coupled to the first node.

10. A VCO comprising:

a tank circuit having a first node and a second node;

a first pair of transistors comprising a first transistor and a second transistor each having a gate, a drain, and a source, wherein the gates of first transistor and the second transistor are coupled together and coupled to the first node;

a second pair of transistors comprising a third transistor and a fourth transistor each having a gate, a drain, and a source, wherein the gates of third transistor and the fourth transistor are coupled together and coupled to the second node, and a third pair of transistors comprising a fifth transistor and a sixth transistor each having a gate, a drain, and a source, wherein the drains of the fifth transistor and the sixth transistor are coupled to the tank circuit, wherein the first transistor and the second transistor are configured to alternately couple the second node to the gate of the sixth transistor, and wherein the third transistor and the fourth transistor are configured to alternately couple the first node to the gate of the fifth transistor.

11. The VCO of claim 10, further comprising:

a first capacitor coupled to the first pair of transistors and the gate of the sixth transistor, and a second capacitor coupled to the second pair of transistors and the gate of the fifth transistor.

12. The VCO of claim 10, wherein:

the first transistor turns on between a first zero crossing and a first middle point of an oscillating voltage signal at the first node and turns off between the first middle point and a second zero crossing of the oscillating voltage signal at the first node, and the second transistor turns on between the second zero crossing and a second middle point of the oscillating voltage signal at the first node and turns off between the second middle point and a third zero crossing of the oscillating voltage signal at the first node.

13. The VCO of claim 12, wherein:

the second node is coupled to the gate of the sixth transistor when the first transistor or second transistor are on, and the second node is not coupled to the gate of the sixth transistor when the first transistor and the second transistor are both off.

14. The VCO of claim 10, wherein:

the fourth transistor turns on between a first zero crossing and a first middle point of an oscillating voltage signal at the second node and turns off between the first middle point and a second zero crossing of the oscillating voltage signal at the second node, and the third transistor turns on between the second zero crossing and a second middle point of the oscillating voltage signal at the second node and turns off between the second middle point and a third zero crossing of the oscillating voltage signal at the second node.

15. The VCO of claim 14, wherein:

the first node is coupled to the gate of the fifth transistor when the third transistor or fourth transistor are on, and the first node is not coupled to the gate of the fifth transistor when the third transistor and fourth transistor are both off.

16. The VCO of claim 10, further comprising:

a fourth pair of transistors comprising a seventh transistor and an eighth transistor each having a gate, a drain, and a source, wherein the gates of the seventh transistor and the eighth transistor are coupled together and coupled to the first node; and a fifth pair of transistors comprising a ninth transistor and a tenth transistor each having a gate, a drain, and a source, wherein the gates of ninth transistor and the tenth transistor are coupled together and coupled to the second node, wherein the seventh transistor and the eighth transistor are configured to alternately couple the second node to a first output node, and wherein the ninth transistor and the tenth transistor are configured to alternately couple the first node to a second output node.

17. The VCO of claim 10, further comprising:

a seventh transistor comprising a gate, a drain, and a source, wherein the gate of the seventh transistor is coupled to the gate of the fifth transistor and the drain is coupled to the second node; and an eighth transistor comprising a gate, a drain, and a source, wherein the gate of the eighth transistor is coupled to the gate of the sixth transistor and the drain is coupled to the first node.

18. A method comprising:

turning on a first transistor in a first pair of transistors based on a first voltage at a first node of a tank circuit, the first voltage being between a first zero crossing and a first middle point of an oscillating voltage signal at the first node;

coupling a second node of the tank circuit to a third node;

turning off the first transistor thereby disconnecting the second node from the third node between the first middle point and a second zero crossing of the oscillating voltage signal at the first node;

turning on a second transistor in the first pair of transistors based on a second voltage at the second node of the tank circuit, the second voltage being between the second zero crossing and a second middle point of the oscillating voltage signal at the first node;

coupling the second node of the tank circuit to the third node; and turning off the second transistor thereby disconnecting the second node from the third node between the second middle point and a third zero crossing of the oscillating voltage signal at the first node.

19. The method of claim 18, wherein coupling the second node to the third node comprises coupling the second node to a third transistor of a cross-coupled pair of transistors.

20. The method of claim 18, wherein coupling the second node to the third node comprises coupling the second node to an output of the tank circuit.

* * * * *